United States Patent
Kang

[11] Patent Number: 6,125,051
[45] Date of Patent: *Sep. 26, 2000

[54] CIRCUIT FOR DRIVING NONVOLATILE FERROELECTRIC MEMORY

[75] Inventor: Hee Bok Kang, Daejeon-si, Rep. of Korea

[73] Assignee: Hyundai Electronics Industries Co., Ltd., Ichon, Rep. of Korea

[*] Notice: This patent is subject to a terminal disclaimer.

[21] Appl. No.: 09/187,735

[22] Filed: Nov. 9, 1998

Related U.S. Application Data

[63] Continuation-in-part of application No. 09/055,985, Apr. 7, 1998.

[30] Foreign Application Priority Data

Dec. 12, 1997 [KR] Rep. of Korea ............ 97-68192
May 13, 1998 [KR] Rep. of Korea ............ 98-17212

[51] Int. Cl.$^7$ .................. G11C 11/22; G11C 11/24; G11C 8/00
[52] U.S. Cl. .................. 365/145; 365/149; 365/230.06
[58] Field of Search .................. 365/145, 149, 365/230.06

[56] References Cited

U.S. PATENT DOCUMENTS

| | | | |
|---|---|---|---|
| 4,433,390 | 2/1984 | Carp et al. | 364/900 |
| 4,873,664 | 10/1989 | Eaton, Jr. | 365/145 |
| 4,888,630 | 12/1989 | Paterson | 365/145 |
| 4,928,095 | 5/1990 | Kawahara | 340/784 |
| 5,371,699 | 12/1994 | Larson | 365/145 |
| 5,373,463 | 12/1994 | Jones, Jr. | 365/145 |
| 5,638,318 | 6/1997 | Seyyedy | 365/145 |
| 5,680,344 | 10/1997 | Seyyedy | 365/145 |
| 5,706,245 | 1/1998 | Kim | 365/230.06 |
| 5,761,138 | 6/1998 | Lee et al. | 365/230.03 |
| 5,815,430 | 9/1998 | Verhaeghe et al. | 365/145 |
| 5,903,492 | 5/1999 | Takashima | 365/145 |
| 5,970,002 | 10/1999 | Yoo | 365/230.06 |

*Primary Examiner*—Trong Phan
*Attorney, Agent, or Firm*—Fleshner & Kim, LLP

[57] ABSTRACT

The memory of the present invention includes a first cell array and a second cell array arranged in a horizontal direction. A first control signal generator and a second control signal generator provide control signals for selecting the first and second cell arrays, respectively. The circuit includes a first and a second signal lines for forwarding control signals from the first local control signal generator for selecting the first cell array from the two cell arrays, third and fourth signal lines for forwarding control signals from the second local control signal generator for selecting the second cell array. A plurality of first split wordline driving signal forwarders are included and each is connected to the first and third signal lines. A plurality of second split wordline driving signal forwarders is also provided, and each is connected to the second and fourth signal lines. An X-address signal forwarder enables the first and second split wordline driving signal forwarders of the plurality of first and second split wordline driving signal forwarders. The present invention simplifies the system of the split wordline driver and minimizes a layout area of the circuit.

35 Claims, 15 Drawing Sheets

E : electric field
P : polarity ferroelectric capacitor reference voltage

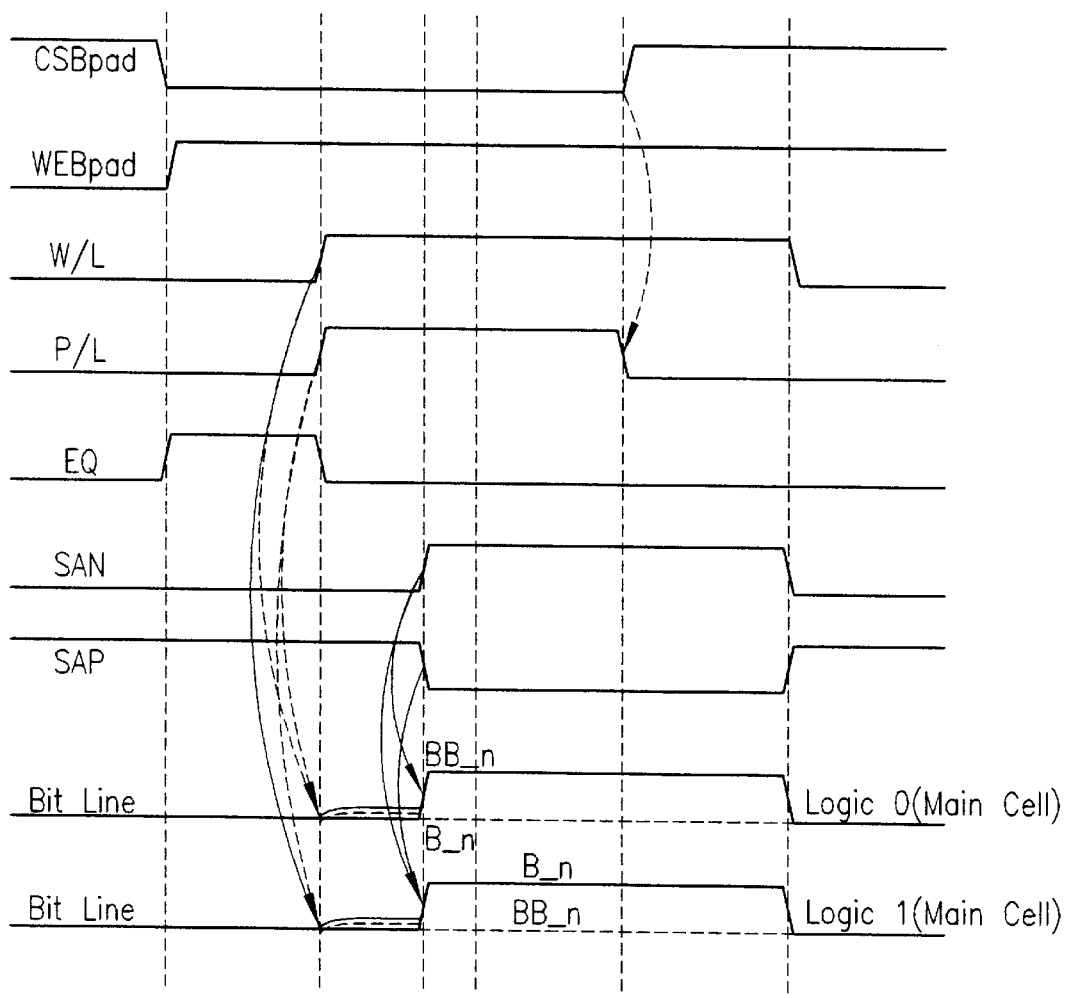

for controlling bottom block

CIRCUIT FOR DRIVING NONVOLATILE FERROELECTRIC MEMORY

This application is a continuation in part of Ser. No. 09/055,985 filed Apr. 7, 1998.

BACKGROUND OF THE INVENTION

1. Field of the Invention

The present invention relates to a ferroelectric memory, and more particularly, to a circuit for driving a ferroelectric memory.

2. Background of the Related Art

A ferroelectric random access memory (FRAM) has a data processing speed as fast as a DRAM and conserves data even after the power is turned off. The FRAM includes capacitors similar to the 45 DRAM, but the capacitors have a ferroelectric substance for utilizing the characteristic of a high residual polarization of the ferroelectric substance in which data is not lost even after eliminating an electric field applied thereto.

FIG. 1A illustrates a general hysteresis loop of a ferroelectric substance, and FIG. 1B illustrates a construction of a unit capacitor in a background art ferroelectric memory. As shown in the hysteresis loop in FIG. 1A, a polarization induced by an electric field does not vanish, but remains at a certain portion ("d" or "a" state) even after the electric field is cleared due to an existence of a spontaneous polarization. These "d" and "a" states may be matched to binary values of "1" and "0" for use as a memory cell. Referring to FIG. 1B, the state in which a positive voltage is applied to a node 1 is a "c" state in FIG. 1A, the state in which no voltage is applied thereafter to the node 1 is a "d" state. Opposite to this, if a negative voltage is applied to the node 1, the state moves from the "d" to an "f" state. If no voltage is applied to the node 1, thereafter the state moves to an "a" state. If a positive voltage is applied again, the states moves to the "c" state via the "b" state. At the end, even if there is no voltage applied on both ends of a capacitor, a data can be stored in stable states of "a" and "d". On the hysteresis loop, "c" and "d" states correspond to a binary logic value of "1", and "a" and "f" states correspond to a binary logic value of "0".

In reading a data from the capacitor, the "d" state is destroyed to read the data stored in the capacitor. In a background art, a sense amplifier is used for reading a data using a voltage generated in a reference voltage generator and a voltage generated in a main cell array. In a ferroelectric reference cell, two modes of "1" polarity and "0" polarity are used for generating a reference voltage on a reference bit line. Accordingly, the sense amplifier compares a bit line voltage on a main cell and a reference bit line voltage on a reference cell, to read information in the main cell. By rewriting the read data within the same cycle, the destroyed data can be recovered.

Referring to FIG. 2, the array of the background art ferroelectric memory cells, each unit memory cell having two transistors and two capacitors (2T/2C) is provided with a plurality of wordlines W/L arranged in one direction and spaced at fixed intervals. A plurality of platelines P/L are arranged parallel to the wordlines and between each of the wordlines W/L. A plurality of bitlines B_n, B_n+1 and bitbarlines BB_n, BB_n+1 are arranged alternatively and in a direction vertical to the wordlines W/L and the platelines P/L.

The gate electrodes of the two transistors T1 and T2 in a unit memory cell 21 are connected to an adjacent wordline W/L in common, and the source electrodes of the transistors T1 and T2 are connected to an adjacent bitline B_n and bitbarline BB_n, respectively. The drain electrodes of the transistors T1 and T2 are connected to the first electrodes of two capacitors, respectively, while the second electrodes of the capacitors are connected in common to an adjacent plateline P/L.

The array of the background art 2T/2C FRAM cells writes and reads a logic value "1" or "0" as follows. Referring to FIG. 3A, in a writing mode, when a chip enable signal CSBpad transits from a "high" to a "low" externally, the array is enabled, and simultaneously, a writing mode enable signal WEBpad also transits from a "high" to a "low" to provide "high" and "low" or "low" and "high" signals to the bitline and the bitbarline according to a logic value intended to be written. An address is decoded to transit a wordline signal of a selected cell from a "low" to a "high" for selecting the cell.

During an interval in which the wordline is held at a "high", a "high" signal of a fixed interval and a "low" signal of fixed interval in succession are applied to a corresponding plateline P/L. For writing a binary logic value "1", a "high" signal is applied to a bitline B_n and a "low" signal is applied to a bitbarline BB_n. For writing a binary logic value "0", a "low" signal is applied to a bitline B_n and "high" signal is applied to a bitbarline BB_n. Thus, either a logic value "1" or a logic value "0" can be written into the capacitor C1 or C2.

Referring to FIG. 3B, when a chip enable signal CSBpad transits from a "high" to a "low" and a write mode enable signal WEBpad transits from a "low" to a "high", the write mode is deactivated and a read mode is enabled. Before selection of a required wordline, all bitlines are equalized to a "low" level by an equalization signal. After completion of the equalizing to the "low" level, an address is decoded to transit a signal on the required wordline from a "low" to a "high" for selecting a corresponding unit cell. A "high" signal is applied to a plateline of the selected cell to cancel a data on the bitline or the bitbarline.

In other words, if a logic value "1" is written, a data in a capacitor connected to the bitline will be destroyed, and if a logic value "0" is written, a data in a capacitor connected to the bitbarline will be destroyed. Thus, depending on the data destroyed on the bitline or on the bitbarline, a value different from each other is provided according to the hysteresis loop characteristics. When the data provided through either the bitline or the bitbarline is sensed by the sense amplifier, the data value will be either logic "1" or logic "0". After the sense amplifier amplifies and provides the data, since the cell should have the data recovered, during the required wordline is applied of "high", the plateline is disabled from a "high" to a "low".

The background art ferroelectric memory has various problems and/or disadvantages. Despite the advantage of data conservation even after the power is turned off, the cell plate line separately required in the FRAM which causes a complicated layout as well as a complicated fabrication process such separate platelines are a disadvantage for mass production. Further, the provision of a control signal to the plateline for data reading and writing degrades efficiency as a memory device.

The background art FRAM also can not solve a problem of integration if a new electrode material and a new barrier material are not provided. In view of the integration, there is another problem in that the incapability of formation of a capacitor directly on a silicon substrate or a polysilicon caused by an inadequate development of the technology of forming a ferroelectric film directly on a silicon surface leads to fabricate a FRAM having an area greater than a DRAM. Moreover, the different transmission paths of control signals through the wordlines and the cell platelines individually result in an inaccurate control.

SUMMARY OF THE INVENTION

An object of the present invention is to substantially obviate one or more of the problems and/or disadvantages of the related art.

It is an object of the present invention to simplify the wordline driver.

Another object of the present invention is to reduce an area of semiconductor layout.

To achieve at least these and other advantages and in accordance with the purpose of the present invention, as embodied and broadly described, the circuit for driving a nonvolatile ferroelectric memory having a first cell array and a second cell array arranged in a horizontal direction and a first control signal generator and a second control signal generator, for providing control signals for selecting the first, and second cell arrays respectively, includes a first, and a second signal lines for forwarding control signals from the first local control signal generator, for selecting the first cell array from the two cell arrays, a third, and a fourth signal lines for forwarding control signals from the second local control signal generator, for selecting the second cell array, a plurality of first split wordline driving signal forwarders each connected to the first and third signal lines, a plurality of second split wordline driving signal forwarders each connected to the second and fourth signal lines, and an X-address signal forwarder for enabling arbitrary first, and second split wordline driving signal forwarders of the plurality of first, and second split wordline driving signal forwarders.

The present invention can be achieved in a whole or in parts by a memory device, comprising: a first memory array having a plurality of memory cells, pairs of first and second wordlines in a first direction and plurality of bitlines in a second direction, each memory cell coupled to a corresponding pair of first and second wordlines in the first direction and coupled to corresponding bitlines in the second direction; a first circuit that provides a plurality of first control signals to the first memory array for at least one of reading data from and writing data to a selected memory cell coupled to the pair of first and second wordlines and the corresponding bitline; and a first split wordline driver coupled to the first circuit and the first memory cell array, wherein the first split wordline driver provides first and second split wordline signals to the pair of first and second wordlines to the selected memory cells based on the first control signals.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 3B illustrates signal timing diagram during a read mode of the background art 2T/2C ferroelectric memory cell;

DETAILED DESCRIPTION OF PREFERRED EMBODIMENTS

Figure 1A:
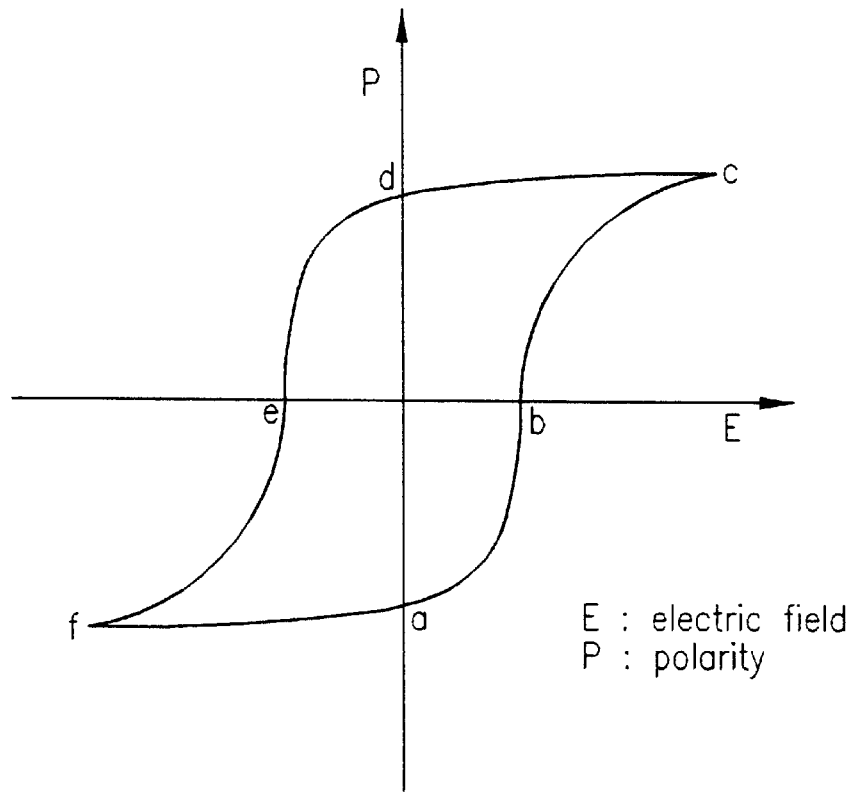
FIG. 1A illustrates a hysteresis characteristic of a ferroelectric capacitor.
Figure 1B:
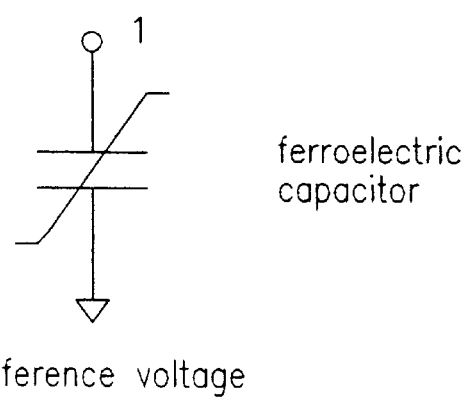
FIG. 1B illustrates a unit capacitor in a background art nonvolatile ferroelectric memory.
Figure 2:
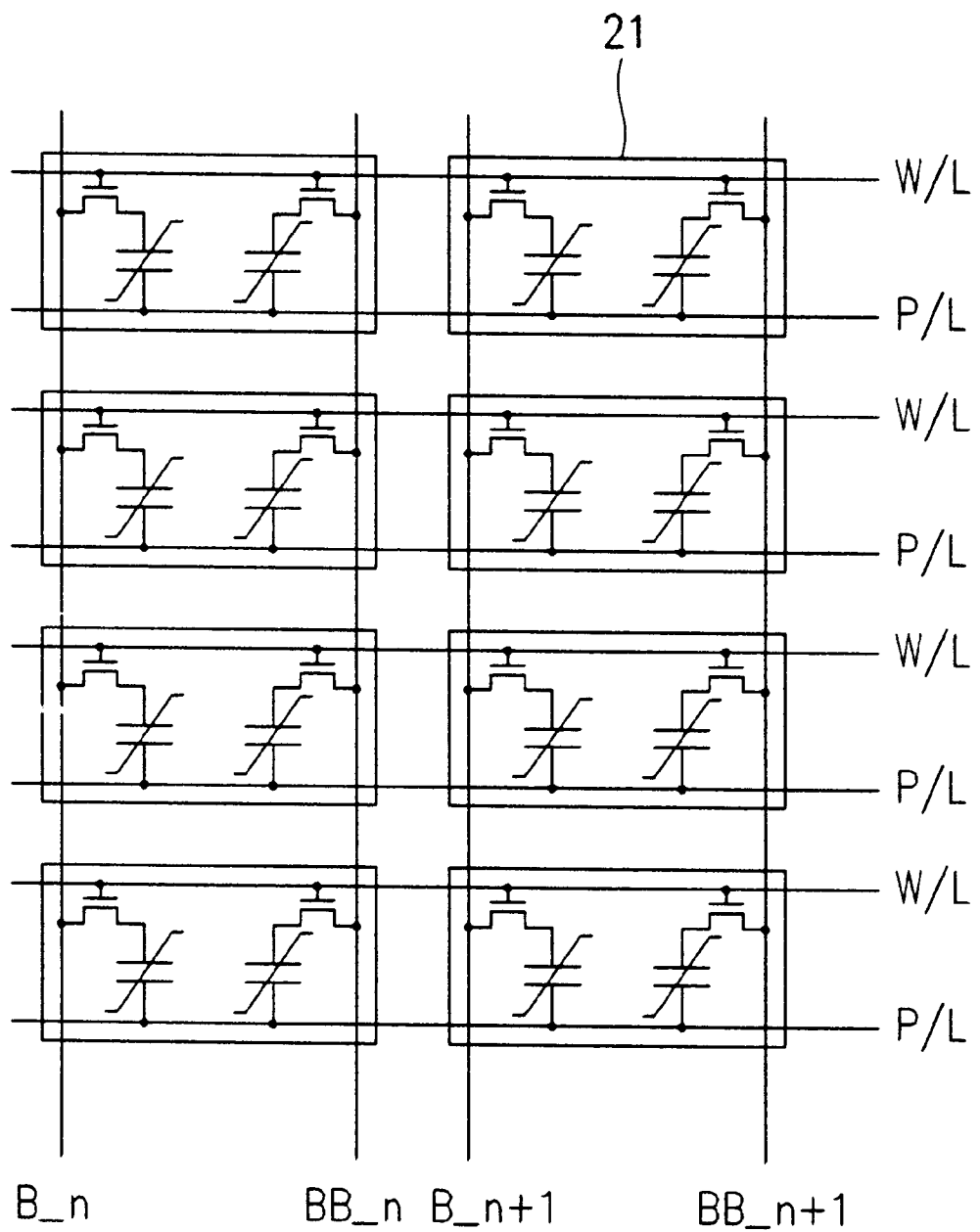
FIG. 2 illustrates a background art nonvolatile ferroelectric memory cell array.
Figure 3A:
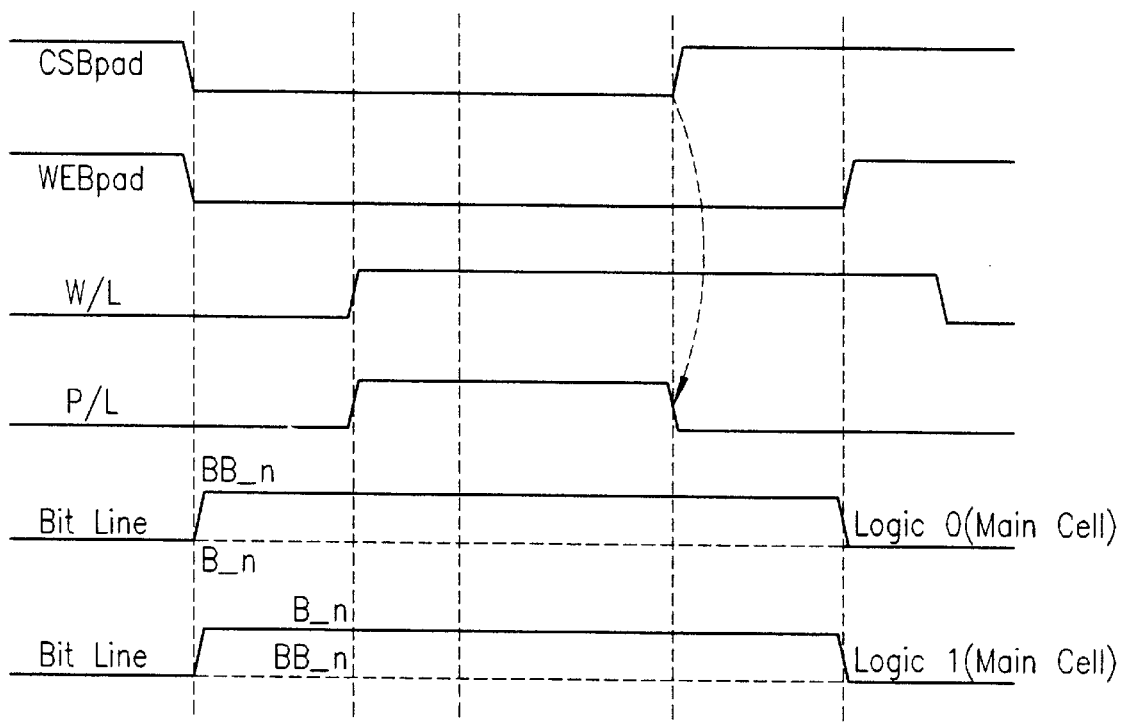
FIG. 3A illustrates signal timing diagram during a write mode of the background art 2T/2C ferroelectric memory cell.
Figure 4:
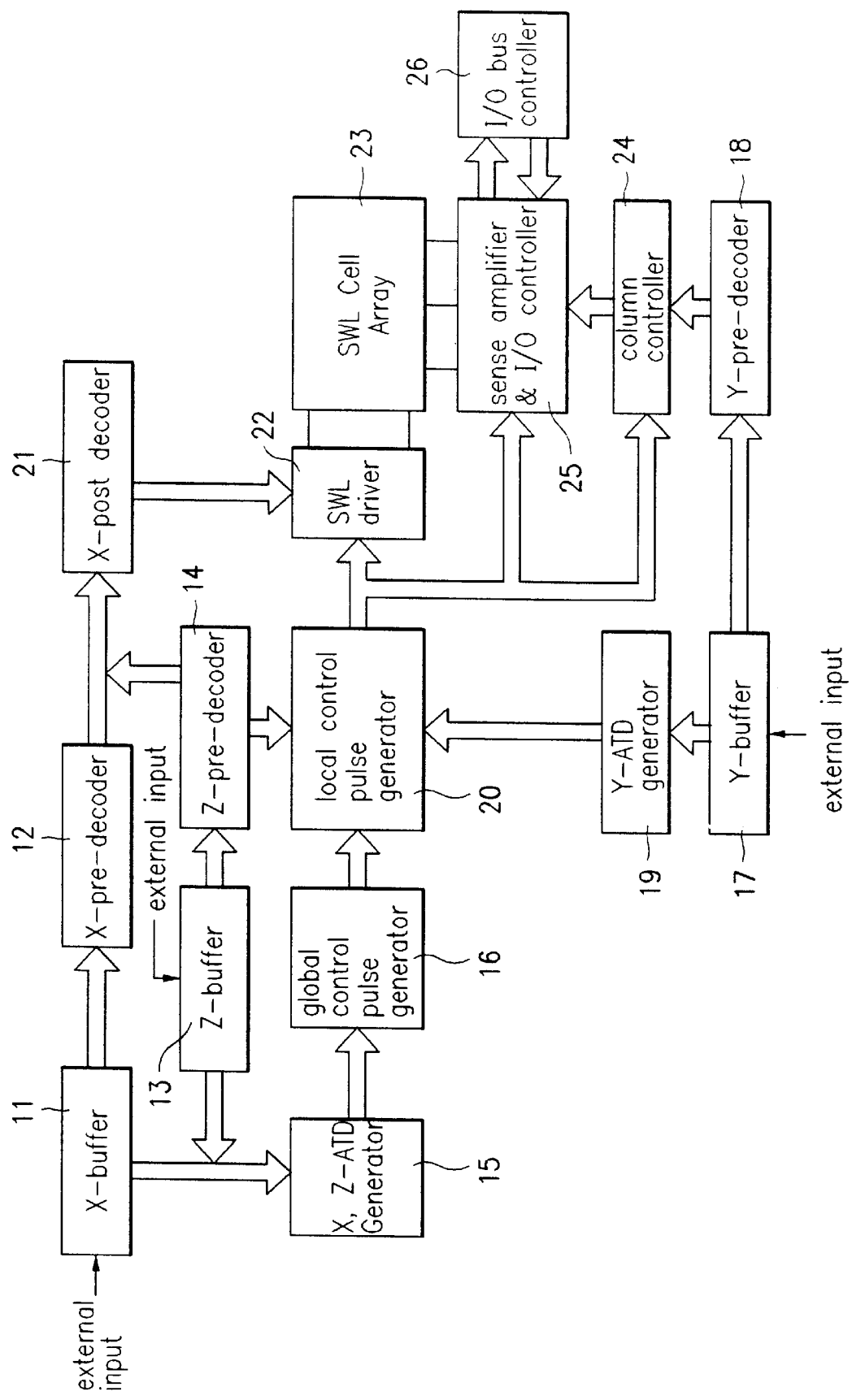
FIG. 4 illustrates a system block diagram of a circuit for driving a nonvolatile ferroelectric memory in accordance with a preferred embodiment of the present invention.

As shown in FIG. 4, a circuit for driving a nonvolatile ferroelectric memory in accordance with a preferred embodiment of the present invention includes an X-buffer 11 for buffering an X address of X-, Y- and Z-addresses, and an X-pre-decoder 12 for pre-decoding a signal from the X-buffer 11. A Z-buffer 13 buffers a Z address of X-, Y- and Z-addresses, a Z-pre-decoder 14 for pre-decoding a signal from the Z-buffer 13. An X, Z-ATD generator 15 detects address transition points of the X-address and Z-address signals from the X-buffer 11 and the Z-buffer 13. A global control pulse generator 16 receives a signal from the X, Z-ATD generator 15 and an external CSB-pad signal for generating a power-up sensing signal for itself to provide a basic pulse for memory control according to the X, Z-ATD signal, the CSBpad signal and the power-up sensing signal. A Y-buffer 17 buffers a Y address of X-, Y- and Z-addresses received externally. A Y-pre-decoder 18 pre-decodes a signal from the Y-buffer 17, and a Y-ATD generator 19 detects an address transition point of the Y-address signal from the Y-buffer 17.

A local control pulse generator 20 combines a signal from the global control pulse generator 16, a Z address pre-decoded signal from the Z-pre-decoder 14 and a signal from the Y-ATD generator 19 into a pulse required in each memory block. An X-post decoder 21 combines the X address pre-decoded signal and the Z address pre-decoded signal from the X-pre-decoder 12 and the Z-pre-decoder 14, respectively, to select a cell block. An SWL driver 22 combines the signals from the X-post decoder 21 and the local control pulse generator 20 to apply a driving signal to split wordlines on each of cell blocks 23. A column controller 24 combines the signals from the Y-pre-decoder 18 and the local control pulse generator 20 to select a bitline. A sense amplifier and I/O controller 25 combines a signal from the local control pulse generator 20 and a signal from the column controller 24 to control operation of the sense amplifier and input/output controller 25. An I/O bus controller 26 interfaces the sense amplifier and the I/O controller 25 to an external data.

Figure 5:
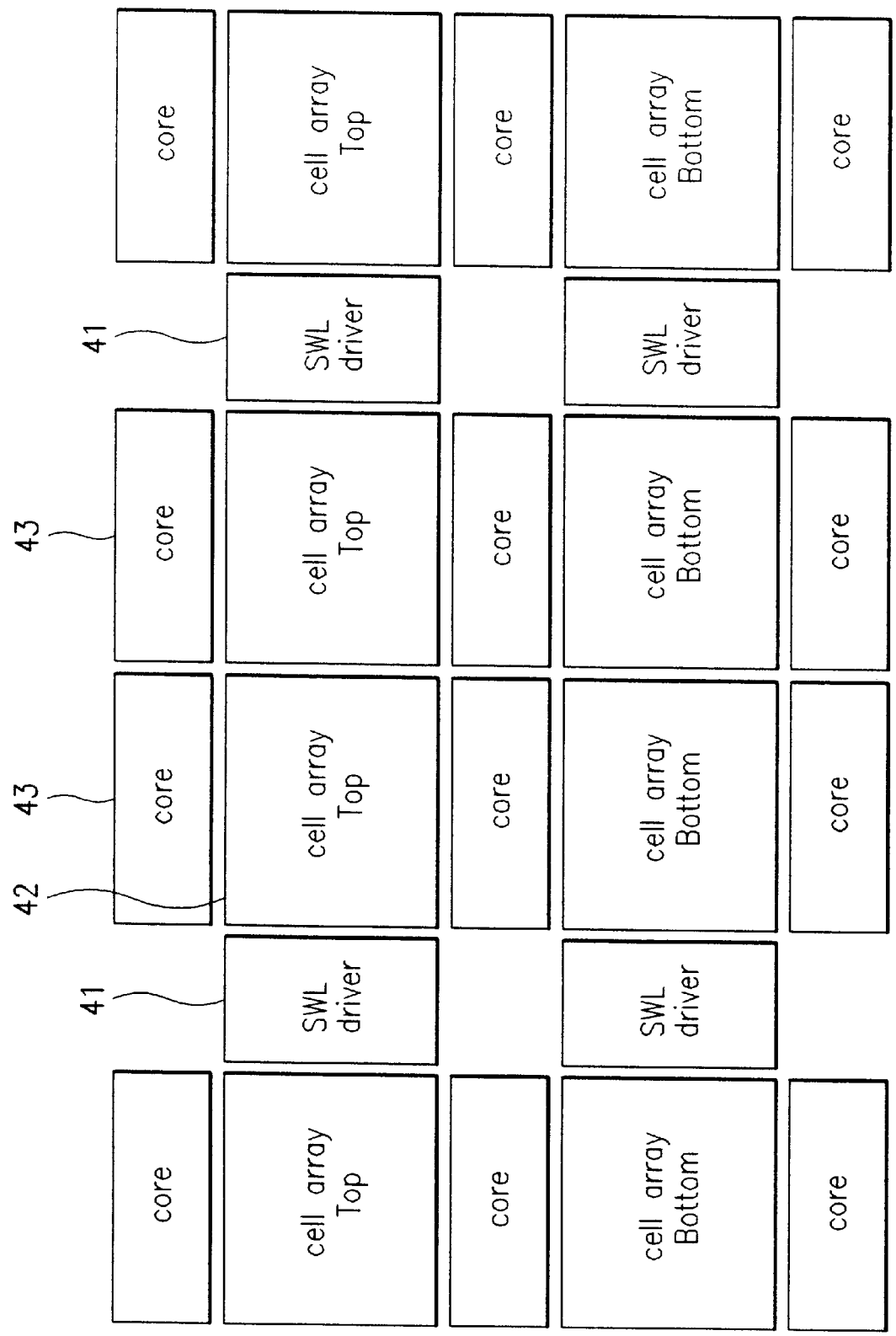
FIG. 5 illustrates a system block diagram of split wordline driver and cell arrays of a nonvolatile ferroelectric memory in accordance with a preferred embodiment of the present invention.

FIG. 5 illustrates an overall system block diagram of a nonvolatile ferroelectric memory chip in accordance with a preferred embodiment of the present invention. The ferroelectric memory chip of the present invention includes split wordline (SWL) drivers 41, each for driving the split wordlines, a cell arrays 42 for storing data, and cores or driving circuit 43 having a sense amplifier block for sensing data, a bitline controlling block for controlling bitlines and a local control signal generator of FIG. 4. The cell arrays 42 are arranged on left and right sides of an SWL driver 41 centered thereon, and the cores 43 are arranged between cell arrays 42 in up and down direction between the cell arrays 42. The sense amplifiers in the cores provided as many as bitlines connected to a bitline and a corresponding bitbarline.

Figure 6:
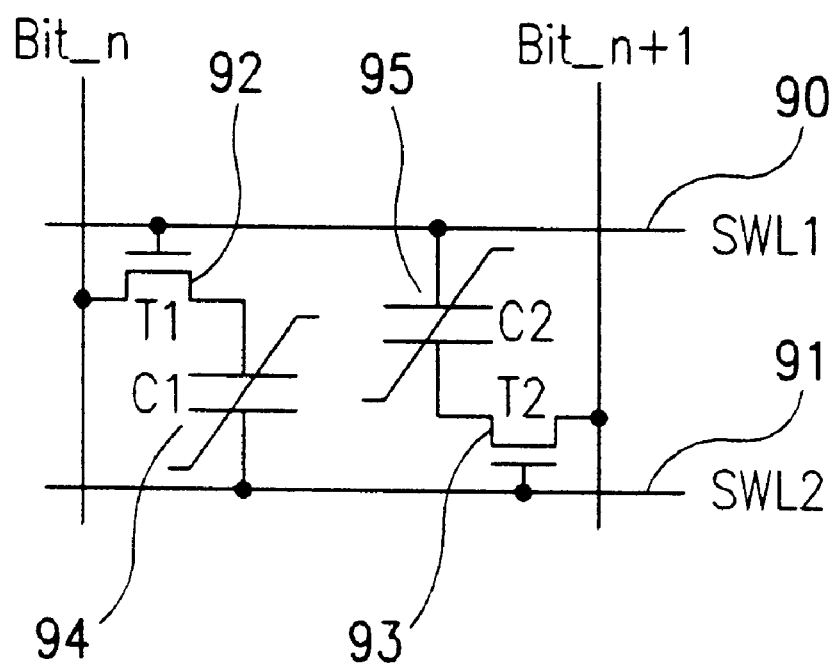
FIG. 6 illustrates a unit cell of a nonvolatile ferroelectric memory in accordance with a preferred embodiment of the present invention.

FIG. 6 illustrates a unit cell of each cell array 42 in a nonvolatile ferroelectric memory chip in accordance with a preferred embodiment of the present invention. The unit cell includes a first transistor (T1) 92 of, e.g., NMOS, having a gate connected to a first split wordline SWL1, a second transistor (T2) 93 of e.g., NMOS, having a gate connected to a second split wordline SWL2. A first ferroelectric capacitor (FC1) 94 has a first electrode connected to the SWL2 and a second electrode connected to a source of the first transistor 92, and a second ferroelectric capacitor (FC1) 95 has a first electrode connected to the SWL1 90 and the second electrode connected to a source of the second transistor 93. A drain of the first transistor 92 is connected to the bitline Bit_n, and a drain of the second transistor 93 is connected to the next bitline Bit_n+1. This unit memory cell can store two data at one row address of one pair of the SWL1 and SWL2 and two column address of one pair of bitlines Bit_n and Bit_n+1.

Figure 7:
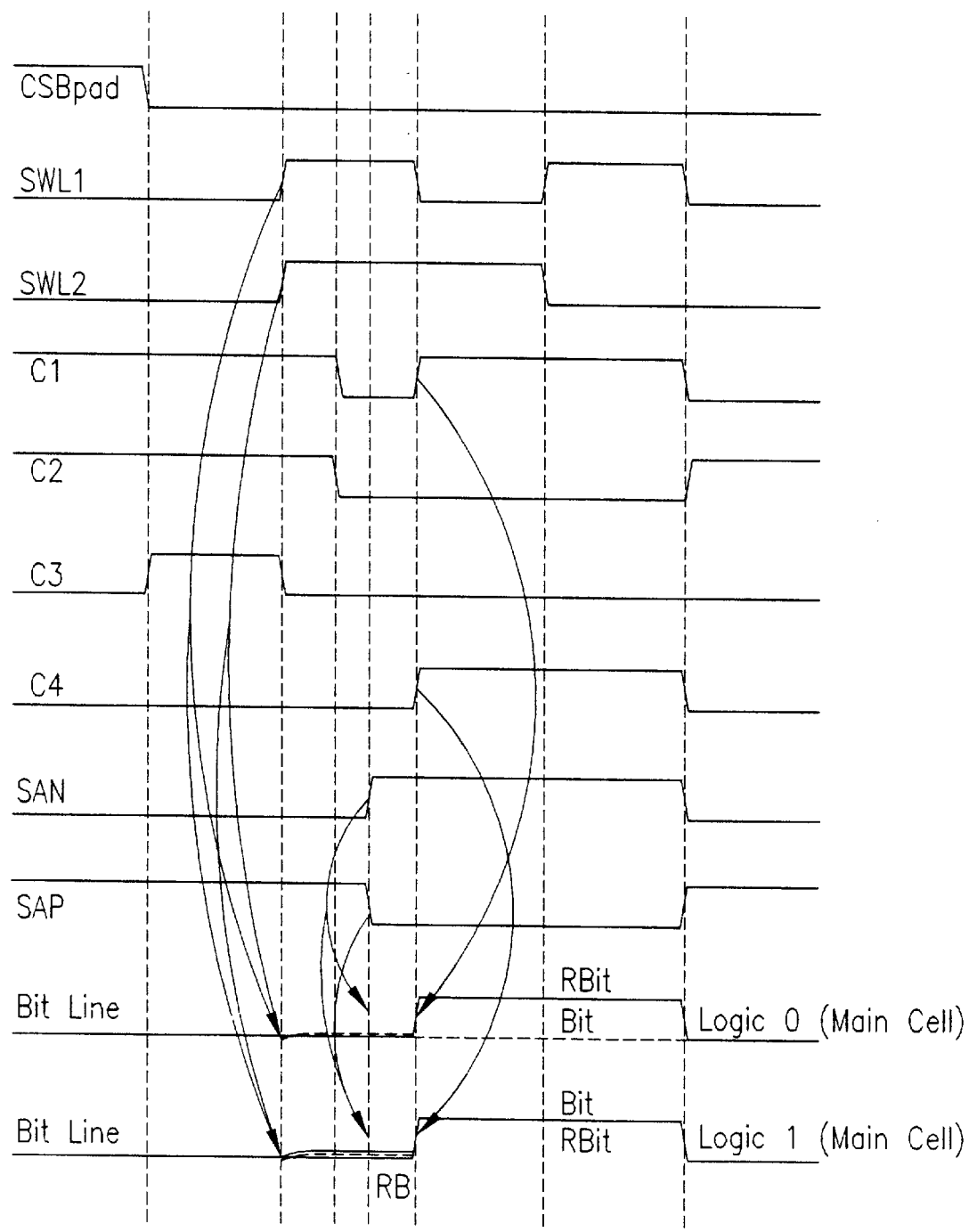
FIG. 7 illustrates signal timing waveform of a nonvolatile ferroelectric memory in accordance with a preferred embodiment of the present invention.

Referring to FIGS. 6 and 7, read and write operations can be performed in a similar fashion using the waveforms of the SWL1 and SWL2. If it is in a write mode, a logic "0" can be stored in the first ferroelectric capacitor FC1 and the second ferroelectric capacitor FC2 in an interval where both of the SWL1 and the SWL2 are high. If it is in a read mode, data stored in the first and second ferroelectric capacitors are loaded on the bitline B_n and the next bitline B_n+1.

If the first ferroelectric capacitor FC1 stores a logic "0" and the second ferroelectric capacitor FC2 stores a logic "1", a voltage loaded on the bitline B_n has a voltage rise lower than a voltage loaded on the next bitline B_n+1. This is because the logic "1" stored in the second ferroelectric capacitor FC2 causes to load a more residual polarization charge on the bitline B_n+1 as the logic "1" is turned to a logic "0", resulting in a greater voltage rise. The polarization destruction from logic "1" to logic "0" in the second ferroelectric capacitor should be restored. Opposite to this, if the first ferroelectric capacitor FC1 stores a logic "1" and the second ferroelectric capacitor FC2 stores a logic "0", in a case when the first, and second split wordlines SWL1 and SWL2 transit to a "high" level, the first ferroelectric capacitor FC1 is turned from logic "1" to a logic "0", which is a destruction of data stored therein.

In such an instance, in order to restore the destroyed data in the first and second ferroelectric capacitors, the following pulse is required. In the case when the first ferroelectric capacitor stored a logic "1" and the second ferroelectric capacitor stored a logic "0", the level "high" is applied to the first split wordline, and a level "low" is applied to the second split wordline to restore a logic "1" after a destructive read operation. In other words, a logic "1" may be restored in the first ferroelectric capacitor FC1 when a high data on the bitline B_n is permitted to be applied to the second electrode of the first ferroelectric capacitor FC1 through the NMOS transistor T1 turned on by the SWL1 and a low voltage applied to the first electrode thereof on an opposite side serves as a reference electrode through the SWL2.

In the case when the first ferroelectric capacitor FC1 stored a logic "0" and the second ferroelectric capacitor FC2 stored a logic "1", a low voltage is applied to the first split wordline SWL1, and a high voltage is applied to the second split wordline SWL2 to restore a logic "1" after a destructive read operation. In other words, a logic "1" may be restored in the second ferroelectric capacitor FC2 when a high data on the bitline B_n+1 is permitted to be applied to second electrode of the second ferroelectric capacitor FC2 through the transistor T2 turned on by the SWL2 91 and a low voltage is applied to the first electrode thereof on an opposite side serving as a reference electrode through the SWL1 90.

The aforementioned read mode operation is applicable to a write mode operation in a similar fashion. In order to store a logic "1" in the first ferroelectric capacitor FC1 again, the first split wordline SWL1 should be applied of a high signal and the second split wordline should be applied of a low signal. And, in order to store a logic "1" in the second ferroelectric capacitor FC2 again, the first split wordline SWL1 should be applied of a low signal and the second split wordline should be applied of a high signal.

Figure 8:
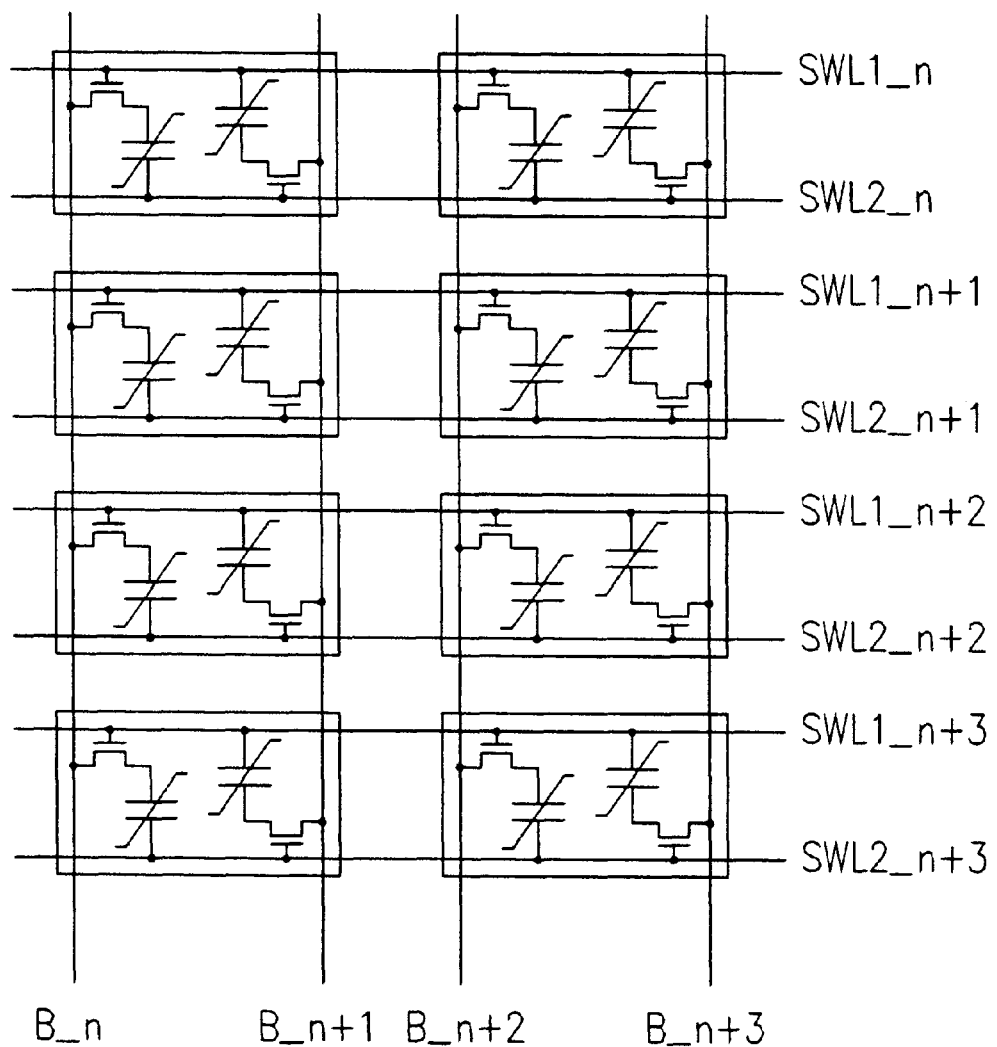
FIG. 8 illustrates a memory cell array using the driving circuit of a nonvolatile ferroelectric memory in accordance with a preferred embodiment of the present invention.

FIG. 8 illustrates a system of memory cell array of a nonvolatile ferroelectric memory in accordance with the present invention. The cell array includes a plurality of first split wordlines SWL1_n, SWL1_n+1, SWL1_n+2, SWL1_n+3, etc., a plurality of second split wordlines SWL2_n, SWL2_n+1, SWL2_n+2, SWL2_n+3, etc., on one side of the split wordlines, a plurality of bitlines B_n, B_n+1, B_n+2, B_n+3, etc., crossing the first, and second split wordlines, and the memory cells formed at intersections of the first and second split wordlines, and odd and even numbered bitlines, respectively, of the plurality of bitlines.

The memory cells can be formed of a folded bitline system in which the memory cell is provided, not at every crossing of the first and second split wordlines with the bitlines, but in view of a particular split wordline, one for every second bitline. Accordingly, the split wordlines are disposed to have a memory cell at every odd or even numbered bitline, which implies that one split wordline alone can not be enabled, but a pair of first and second split wordlines SWL1 and SWL2 should be enabled simultaneously.

Figure 9:
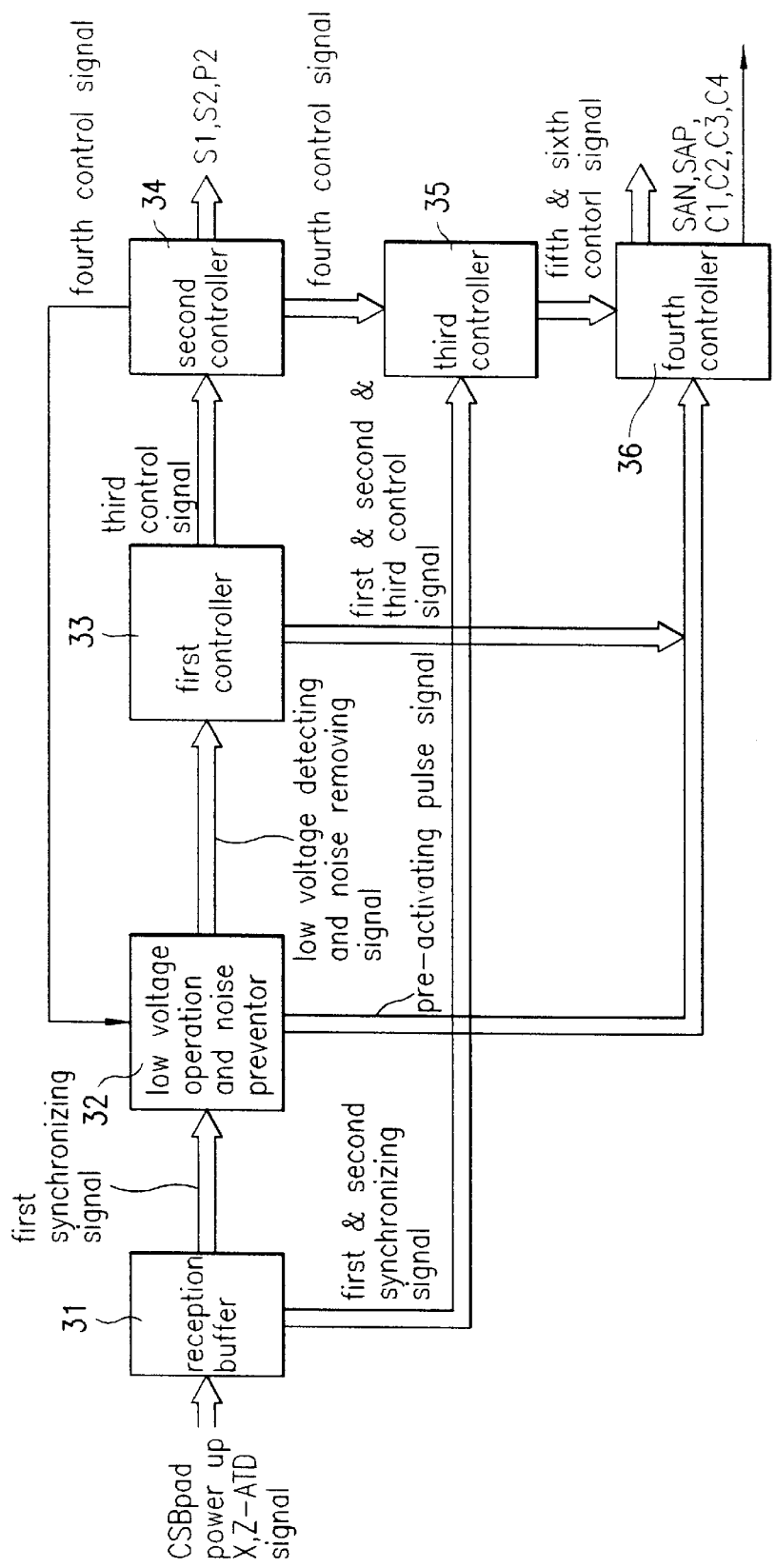
FIG. 9 illustrates a global control signal generator of a circuit for driving a nonvolatile ferroelectric memory in accordance with a preferred embodiment of the present invention.

FIG. 9 illustrates a system block diagram of a global control pulse generator of FIG. 4. A reception buffer 31 receives a signal containing at least CSBpad signal, the X, Z-ATD signal and the power-up detecting signal and provides first and second synchronizing signals. A low voltage operation and noise preventor 32 provides: (1) a low voltage detecting signal for stopping the operation at a low voltage, (2) a noise canceling signal for filtering a noise in the first synchronizing signal, and (3) a pre-activating pulse for pre-charging the bitlines and the like in response to the first synchronizing signal from the reception buffer 31 and a feed back signal.

When a normal power supply voltage is supplied from the low voltage operation and noise preventor 32, a first controller receives a signal having the noise removed therefrom and provides (1) a first control signal for controlling an enable time point of the sense amplifier, (2) a second control signal for controlling a column selection enable time point and a bitline and bitbarline pull-up, and (3) a third control signal for providing a signal for the SWL driver and other control signals.

A second controller 34 receives the third control signal from the first controller 33 and generates (1) preliminary signals S1 and S2 for generating signals to be applied to a pair of first and second split wordlines SWL1 and SWL2 in the SWL driver, (2) a fourth control signal which is a basic pulse signal for controlling enabled time periods of the signals S1 and S2 and (3) a pulse signal P2 having a driving capability improved from the fourth control signal. The second controller 34 provides the fourth control signal to the low voltage operation and noise preventor 32 as a feed back signal, and the pulse signal P2 to the local control pulse generator 20.

A third controller 35 receives the first and second synchronizing signals from the reception buffer 31 and the fourth control signal from the second controller 34 and provides (1) a fifth control signal for controlling the synchronization to the CSBpad signal if all signal except the preliminary signals are disabled and (2) a sixth control signal for interrupting a disabled state of the CSBpad signal if the CSBpad signal is disabled under a state that the preliminary signal S1 and the preliminary signal S2 are enabled. The third controller 35 sustains the enabled state until the completion of normal operations of the preliminary signals S1 and S2.

A fourth controller 36 is coupled for receiving the fifth and sixth control signals from the third controller 35, the first, second and third control signals from the first controller 33 and the pre-activating pulse from the low voltage operation and noise preventor 32. The fourth controller 36 provides (1) preliminary signals SAN and SAP for generating enable signals for the sense amplifier, (2) a control signal C3 for controlling low voltage pre-charges between a bitline and a bitbarline on a main cell and I/O terminals on the sense amplifier, and (3) a control signal C4 for controlling a pull-up at a column selection enable time point.

In the meantime, if the externally applied signals (the CSBpad signal, the X, Z-ATD signal and the power-up detecting signal) to the global control pulse generator are stable, the low voltage operation and noise preventor may be dispensed. The global control signal generator provides, a preliminary signal C3 for providing a control signal C3_C to be applied to the sense amplifier and I/O controller 25, preliminary signals S1 and S2 for providing control signals PS1 and PS2 to be applied to the split wordline drivers 22, a preliminary signal for providing a control signal C4N to be applied to the column controller 24, and preliminary signals C1 and C2 for controlling connection between bitlines and the I/O terminal on the sense amplifier to the local control signal generator 20.

Figure 10:
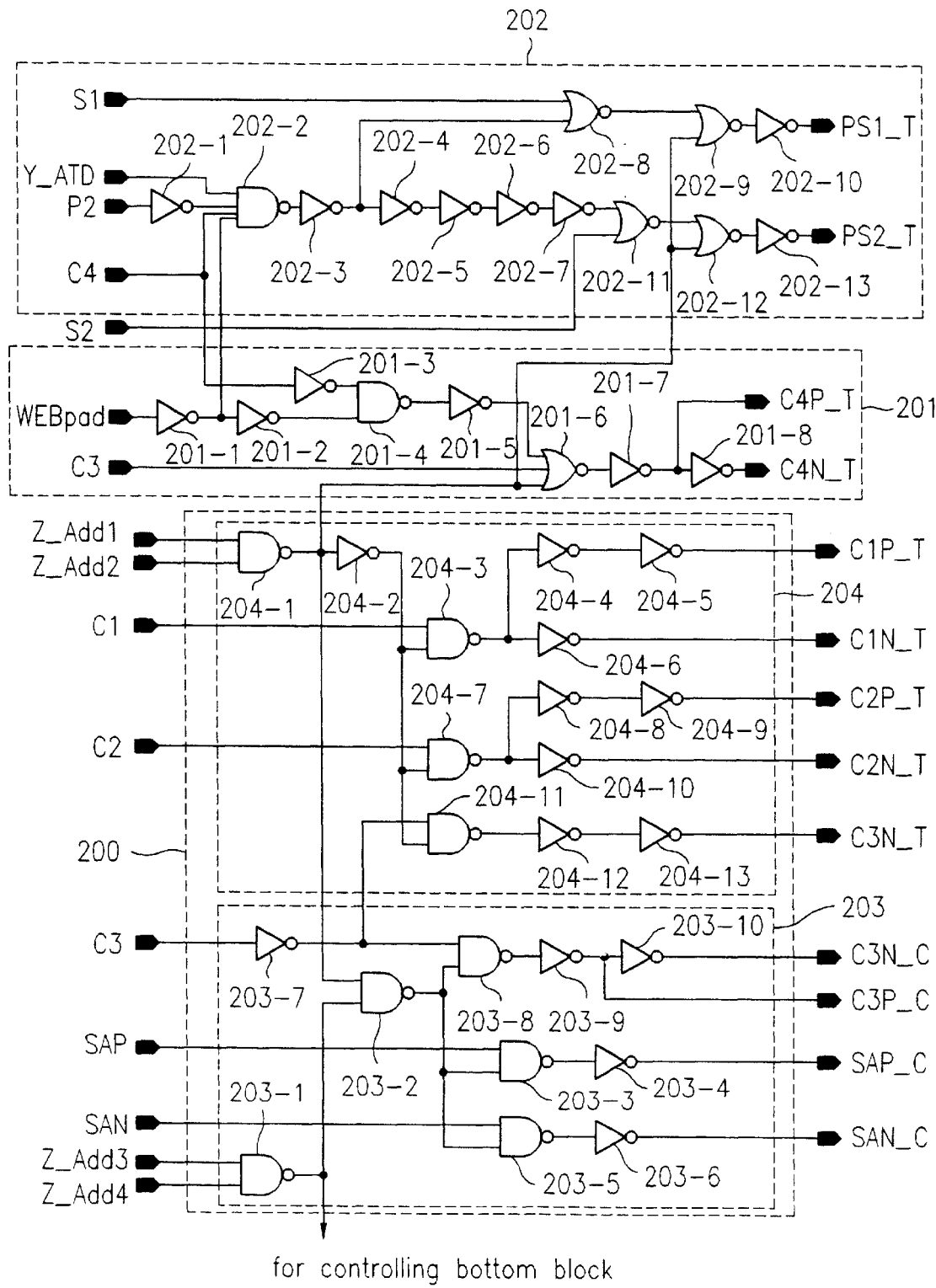
FIG. 10 illustrates a local control signal generator for driving a nonvolatile ferroelectric memory in accordance with a preferred embodiment of the present invention.

FIG. 10 illustrates the local control signal generator in a circuit for driving a nonvolatile ferroelectric memory in accordance with a preferred embodiment of the present invention. The signals S1, S2, P2, C1, C2, C3, C4, SAN and SAP to the local control signal generator are provided from the global control signal generator. The Y-ATD signal, being a Y-address transition detecting signal for detecting a time point of a Y-address transition, is a high pulse. The WEBpad signal is a signal of a write enable pad, and, in a write mode, its low state is defined as an enabled state. Signals of Z-Add1, Z-Add2, Z-Add3 and Z-Add4 are provided from a Z-address pre-decoder. As an example, the local control signal generator of FIG. 10 is provided for selecting memory cells on a left side of the SWL driver shown in FIG. 5. The local control signal generator provided for selecting memory cells on a right side of the SWL driver has a system identical to the local control signal generator provided for selecting memory cells on a left side of the SWL driver.

The local control signal generator 20 includes (1) a first control signal generator 200 for generating signals provided to the sense amplifier and I/O controller 25, (2) a second control signal generator 201 for generating signals provided to the column controller 24, and (3) a third control signal generator 202 for generating signals provided to the split wordline driver 22. The first control signal generator 200 includes a first logical operator 203 for subjecting SAN, SAP, Z-Add3, Z-Add4 and the third control signal C3 to logical operation to provide SAN_C, SAP_C, C3N_C and C3P_C, and a second logical operator 204 for receiving the first, and second control signals C1 and C2 and Z-Add1 and Z-Add2 and providing control signals of C1P_T, C1N_T, C2P_T, C2N_T and C3N_T for controlling memory cells on an upper side.

The first logical operator 203 in the first control signal generator 200 includes a first NAND gate 203-1 for subjecting Z-Add3 and Z-Add4 signals to logical operation to provide a signal involved in generation of control signals to be applied to memory cells on a lower side. A second NAND gate 203-2 subjects a signal from the first NAND gate 203-1 and NAND operated Z-Add1 and Z-Add2 signals to a logical operation, and a third NAND gate 203-3 subjects a received SAP signal and a signal from the second NAND gate 203-2 to logical operation. A first inverter 203-4 inverts a signal from the third NAND gate 203-3 to provide a SAP_C signal. A fourth NAND gate 203-5 subjects a received SAN signal and a signal from the second NAND gate 203-2 to a logical operation and a second inverter 203-6 inverts a signal from the fourth NAND gate 203-5 to provide an SAN_C signal. A third inverter 203-7 inverts a third control signal C3 from the global control signal generator, and a fifth NAND gate 203-8 subjects a signal from the second NAND gate 203-2 and a signal from the third inverter 203-7 to a logical operation. A fourth inverter 203-9 inverts a signal from the fifth NAND gate 203-8 to provide a C3P_C signal, and a fifth inverter 203-10 inverts a signal C3 from the fourth inverter 203-9 to provide a C3N_C signal.

The second logical operator 204 in the first control signal generator 200 includes a first NAND gate 204-1 for subjecting Z-Add1 and Z-Add2 signals to logical operation to provide a signal involved in generation of control signals to be applied to memory cells on an upper side. A first inverter 204-2 inverts a signal from the first NAND gate 204-1, and a second NAND gate 204-3 subjects a signal from the first inverter 204-2 and a first control signal C1 to a NAND operation. The second and third inverters 204-4 and 204-5 enhances a signal from the second NAND gate 204-3 to provide a C1P_T signal. A fourth inverter 204-6 inverts a signal from the second NAND gate 204-3 to provide a C1N_T signal. A third NAND gate 204-7 subjects a signal from the first inverter 204-2 and a second control signal C2 to a logical operation. The fifth and sixth inverters 204-8 and 204-9 enhance a signal from the third NAND gate 204-7 to provide a C2P_T signal. A seventh inverter 204-10 inverts a signal from the third NAND gate 204-7 to provide a C2N_T signal, and a fourth NAND gate 204-11 subjects a signal from the first inverter 204-2 and the inverted third control signal C3 to a logical operation. The ninth and tenth inverters 204-12 and 204-13 enhance a signal from the fourth NAND gate 204-11 to provide a C3N_T signal.

The second control signal generator 201 includes a first inverter 201-1 for inverting a WEBpad signal, and a second inverter 201-2 for inverting a signal from the first inverter 201-1. A third inverter 201-3 inverts a fourth control signal C4 and a NAND gate 201-4 subjects signals from the second and third inverters 201-2 and 201-3 to a logical operation. A fourth inverter 201-5 inverts a signal from the NAND gate 201-4, and an NOR gate 201-6 subjects the third control signal C3, a signal from the fourth inverter 201-5 and a signal from the first NAND gate 204-1 in the first logical operator 204 of the first control signal generator 200 to a NOR operation. A fifth inverter 201-7 inverts a signal from the NOR operator 201-6 to provide a C4P_T signal, and a sixth inverter 201-8 inverts a signal from the fifth 201-7 to provide a C4N_T signal.

The third control signal generator 202 includes a first inverter 202-1 for inverting a P2 signal. A first NAND gate 202-2 subjects a Y-ATD signal, a signal from the first inverter 202-1, a fourth control signal C4, and the inverted WEBpad signal to a logical operation. A second inverter 202-3 inverts a signal from the first NAND gate 202-2, and third, fourth, fifth and sixth inverters 202-4, 202-5, 202-6 and 202-7 delay a signal from the second inverter 202-3. A first NOR gate 202-8 subjects an S1 signal and a signal from the second inverter 202-3 to a logical operation. A second NOR gate 202-9 subjects a signal from the first NOR gate 202-8 and a signal from the first NAND gate 204-1 of the second logical operator 204 to a NOR operation. A seventh inverter 202-10 inverts a signal from the second NOR gate 202-9 to provide a PS1_T signal and a third NOR gate 202-11 subjects a second control signal C2 and a signal from the sixth inverter 202-7 to a NOR operation. A fourth NOR gate 202-12 subjects a signal from the third NOR gate 202-11 and a signal from the first NAND gate 204-1 of the second logical operator 204 to a NAND logic operation, and a seventh inverter 202-13 inverts a signal from the fourth NOR gate 202-12 to provide a PS2_T signal.

The first logical operator 203 of the first control signal generator 200 generates signals to be provided to both the memory cells on the upper side and the memory cells on the lower side in common. The second logical operator 204 of the first control signal generator 200, and the second and third control signal generators 201 and 202 generate signals for controlling memory cells on the upper side. The PS1_T and PS2_T signals control signals for controlling memory cells on the upper side and the PS1_B and PS2_B signals are control signals for controlling memory cells on the lower side, which are applied to the SWL driver.

What is explained up to now is a process for providing control signals required for selecting memory cells on a left side centered on the SWL driver 22. As has been explained, a process for providing control signals required for selecting memory cells on a right side is substantially identical to the process for providing control signals required for selecting memory cells on the left side. Therefore, the local control signal generator 20 on the right side also provides signals of PS1_T and PS2_T and PS1_B and PS2_B to a center SWL driver 22. Of course, a process for providing the PS1_B and PS2_B signals is identical to the process for providing the PS1_T and PS2_T signals. Therefore, depending on the side of the local control signal generator 20 from which the PS1 signal and the PS2 signal are provided, a cell array either on the right side or the left side is selected, naturally.

Figure 11:
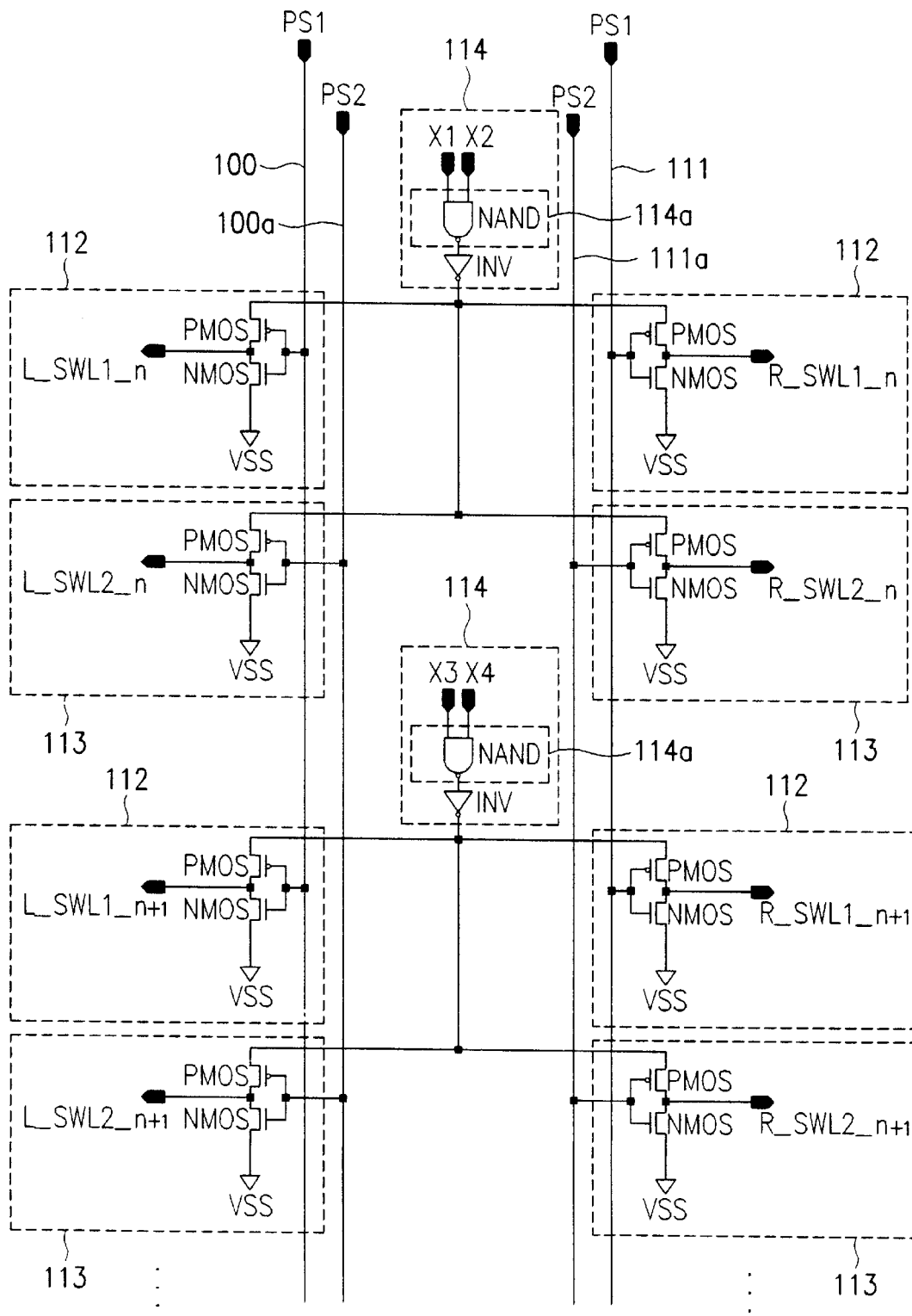
FIG. 11 illustrates a first embodiment split wordline driver for driving a nonvolatile ferroelectric memory in accordance with a preferred embodiment of the present invention.

FIG. 11 illustrates a system of a first embodiment split wordline driver of a circuit for driving a nonvolatile ferro-electric memory in accordance with a first embodiment of the present invention. The first embodiment split wordline driver includes first, and second signal lines 100 and 100a for transmission of PS1 and PS2 signals respectively (in this instance, the PS1 and PS2 signals may be PS1_T and PS2_T signals or PS1_B and PS2_B signals) from the local control signal generator which provides control signals required for selecting the cell array on the left side of the SWL driver and third and fourth signal lines 111 and 111a for transmission of PS1 and PS2 signals respectively (in this instance, the PS1 and PS2 signals may be PS1_T and PS2_T signals or PS1_B and PS2_B signals) from the local control signal generator which provides control signals required for selecting the cell array on the right side of the SWL driver. A plurality of first SWL driving signal forwarders 112, are connected to the first signal line 100 or the third signal line 111, and a plurality of second SWL driving signal forwarders 113 are connected to the second signal line 100a or the fourth signal line 111a.

A plurality of X-address signal forwarders 114 receive and decode an X-addresses and provide a control signal for selecting a pair of the first and second SWL driving signal forwarders 112 and 113 from the plurality of the first and second SWL driving signal forwarders 112 and 113. The X-address signal forwarder 114 includes a decoder 114a for receiving and decoding at least two X-addresses and an inverter INV for inverting a signal from the decoder 114a. The X-address signal forwarder 114 provides control signals for selecting the pair of first and second SWL driving signal forwarders 112 and 113. Accordingly, if the first and second SWL driving signal forwarders 112 and 113 are of plural pairs, the X-address signal forwarder 114 also has a plural pairs.

For example, when the first and second SWL driving signal forwarders 112 and 113 are of eight pairs, the X-address signal forwarder 114 also has eight pairs. Accordingly, only the X-address signal forwarder 114 connected to the first and second SWL driving signal forwarders 112 and 113 intended to be selected is enabled from the first to eighth pairs of the first and second SWL driving signal forwarders 112 and 113. A number of X-addresses provided to the decoder 114a is dependent on a number of the first and second SWL driving signal forwarders 112 and 113.

In the aforementioned SWL driver, when the first and second signal lines 100 and 100a are enabled at "low" at a time, the driving signal is provided to the cell arrays on the left side, and when the third and fourth signal lines 111 and 111a are enabled at "low" at a time, the driving signal is provided to the cell arrays on the right side. That is, depending on whether the first and second signal lines 100 and 100a are enabled or the third and fourth signal lines 111 and 111a are enabled, the driving signal is provided to cell arrays on a corresponding side (left or right).

Selection of the first and second SWL driving signal forwarders 112 and 113 from the plurality of the first and second SWL driving signal forwarders 112 and 113 is dependent on signal from the X-address signal forwarder 114, which is enabled. That is, even if one cell array is selected from the left and right cell arrays depending on an enabled state of the first and second signal lines 100 and 100a and the third and fourth signal lines 111 and 111a, the plurality of the first and second split wordline pairs in the selected cell array can not be enabled at a time. In order to apply the driving signal to a pair of first and second split wordlines selectively of the plurality of first and second split wordline pairs, only one X-address signal forwarder 114 should be enabled. As explained, the SWL driver is connected to the cell arrays on the left side as well as on the right side and provides the driving signal only to a pair of first and second split wordlines of the plurality of first split wordline SWL1_n, SWL1_n+1, SWL1_n+2, etc., and second split wordline SWL2_n, SWL2_n+1, SWL2_n+2, etc.

Referring to FIG. 11, each of the SWL driving signal forwarders 112 and 113 to includes a PMOS transistor and an NMOS transistor connected in series, with gates of the transistors connected in common. The first signal line 100 and the third signal line 111 have a plurality of first SWL driving signal forwarders 112 connected thereto, and the second signal line 100a and the fourth signal line 111a have a plurality of second SWL driving signal forwarders 113 connected thereto, opposite to the first SWL driving signal forwarders 112. Therefore, the first SWL driving signal forwarder 112 and the second SWL driving signal forwarder 113 connected to the first signal line 100 and the second signal line 100a, respectively, provide driving signals to the cell array on the left side, and the first SWL driving signal forwarder 112 and the second SWL driving signal forwarder 113 connected to the third signal line 11 and the fourth signal line 111a, respectively, provide driving signals to the cell array on the right side.

The signal lines 100, 100a, 111 and 111a are connected to a common gate of the PMOS transistor and the NMOS transistor in the SWL driving signal forwarders 112 and 113, respectively. Therefore, if the PS1 and PS2 signals provided through the first and second signal lines 100 and 100a are at "low" and when a signal from the X-address signal forwarder 114 which decodes an X1 or X2-address signal is enabled, a first pair of the first and second SWL driving signal forwarders 112 and 113 of the plurality pairs of the first and second SWL driving signal forwarders 112 and 113 on the left side are enabled, to enable the first and second split wordlines L_SWL1_n and L_SWL_n. Opposite to this, if the PS1 and PS2 signals provided through the third and fourth signal lines 111 and 111a are at "low" and when a signal from the X-address signal forwarder 114 which decodes an X1 or X2-address signal is enabled, a first pair of the first and second SWL driving signal forwarders 112 and 113 of the plurality pairs of the first and second SWL driving signal forwarders 112 and 113 on the right side are enabled, to enable the first and second split wordlines R_SWL1_n and R_SWL_n.

In the meantime, if the PS1 and PS2 signals provided through the first and second signal lines 100 and 100a are at "low" and when a signal from the X-address signal forwarder 114 which decodes an X3 or X4-address signal is enabled, a second pair of the first and second SWL driving signal forwarders 112 and 113 of the plurality pairs of the first and second SWL driving signal forwarders 112 and 113 on the left side are enabled, to enable the first and second split wordlines L_SWL1_n+1 and L_SWL_n+1. Opposite to this, if the PS1 and PS2 signals provided through the third and fourth signal lines 111 and 111a are at "low" and when a signal from the X-address signal forwarder 114 which decodes an X3 or X4-address signal is enabled, a second pair of the first and second SWL driving signal forwarders 112 and 113 of the plurality pairs of the first and second SWL driving signal forwarders 112 and 113 on the right side are enabled, to enable the first and second split wordlines R_SWL1_n+1 and R_SWL_n+1.

In conclusion, the selection of cell arrays from the cell arrays on the left side or the cell arrays on the right side is dependent on PS1 and PS2 signals applied through the first and second signal lines 100 and 100a and the third and fourth signal lines 111 and 111a, and the selection of a pair of the first and second SWLs after selection of a side from left and right sides of cell arrays is dependent on signals X1, X2, X3 and X4 applied to the decoder 114a.

Figure 12:
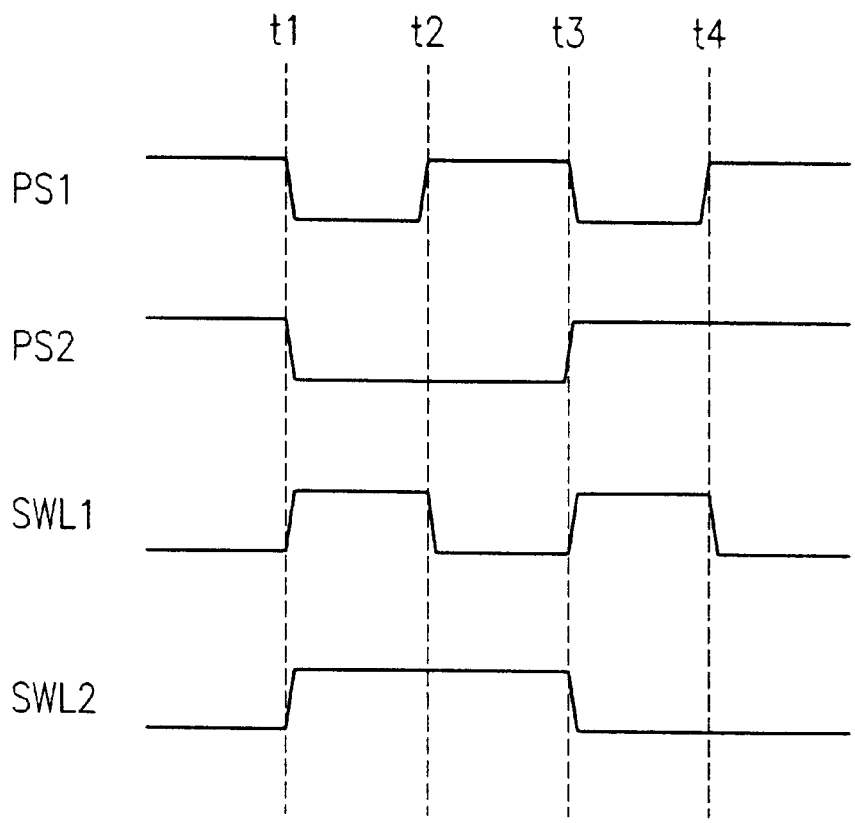
FIG. 12 illustrates an operational timing waveform of input and output signals of a split wordline driver in accordance with a preferred embodiment of the present invention.

The timing waveform of PS1 and PS2 signals applied through the first and second signal lines 100 and 100a and the third and fourth signal lines 111 and 111a with respect to signals from the SWL driving signal forwarders 112 and 113 are shown in FIG. 12. The PS1 signal and the first split wordline signal SWL1, as well as the PS2 signal and the first split wordline signal SWL2, have opposite phases and identical transition timings. As shown in the timing diagram, until t1 at which both the PS1 and PS2 are at a high, both the first and second split wordline signals SWL1 and SWL2 are held at a low. In t2 interval, where PS1 and PS2 signals are held at a high and a low, respectively, the first split wordline signal SWL1 is held at a low and the second split wordline signal SWL2 is maintained at a previous state of t1.

In t3 interval, where PS1 and PS2 are held at a low and a high, respectively, the first split wordline signal SWL1 transits from a previous low to a high, and the second split wordline signal SWL2 transits from a previous high to a low. In t4 interval, where both PS1 and PS2 are held at high, the first split wordline signal SWL1 transits from a previous high to a low and the second split wordline signal SWL2 is held at low, which is the same as a state in t3 interval. As can be seen from the timing diagram, when both the PS1 and PS2 signals are held at a low, the first split wordline signal SWL1 and the second split wordline signal SWL2 are enabled, to select a memory cell.

Figure 13:
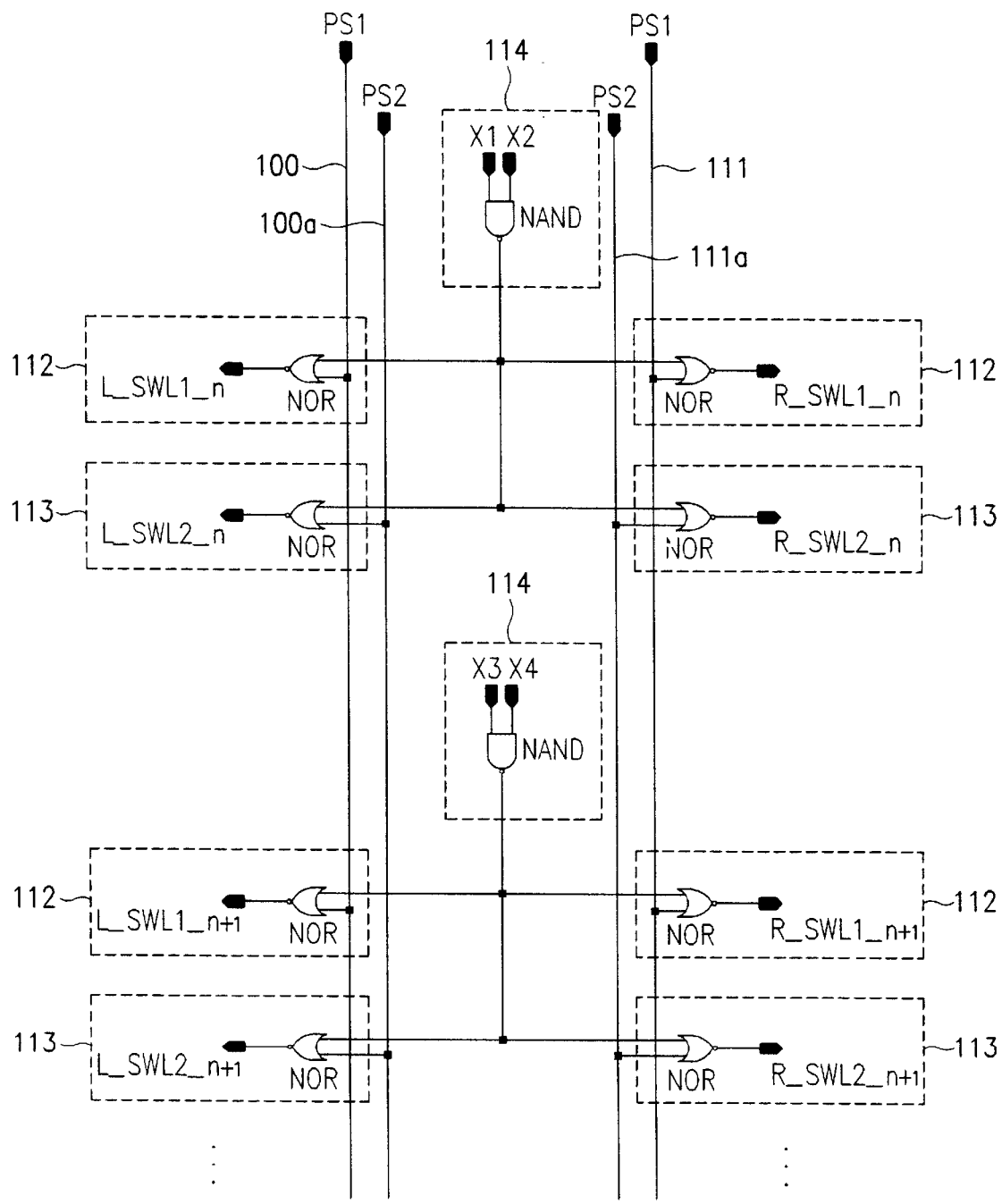
FIG. 13 illustrates a second embodiment split wordline driver for driving a nonvolatile ferroelectric memory in accordance with a preferred embodiment of the present invention.

FIG. 13 illustrates a system of a second embodiment split wordline driver of a circuit for driving a nonvolatile ferroelectric memory in accordance with a preferred embodiment of the present invention. In comparison to the first embodiment, the second embodiment split wordline driver of the present invention includes split wordline driving signal forwarders 112 and 113 (each having an NOR gate) and X-address signal forwarders 114 (each having an NAND gate). For example, the NOR gate of the first SWL driving signal forwarder 112 has one input terminal adapted to be applied of a signal from the X-address signal forwarder 114 and the other input terminal connected to the first signal line 100. The NOR gate of the second SWL driving signal forwarder 113 has one input terminal adapted to be applied of a signal from the X-address signal forwarder 114 and the other input terminal connected to the second signal line 100a.

The application of the first and second SWL driving signal forwarders 112 and 113 for providing driving signals ti select the cell arrays on the left side is identical to the application of the first and second SWL driving signal forwarders 112 and 113 for providing driving signals to select the cell arrays on the right side, except that the NOR gate of the first SWL driving signal forwarder 112 has an input terminal connected to the third signal line 111 as well as the signal from the X-address signal forwarder 114, and the NOR gate of the first SWL driving signal forwarder 113 has an input terminal connected to the fourth signal line 111a as well as the signal from the X-address signal forwarder 114.

Figure 14:
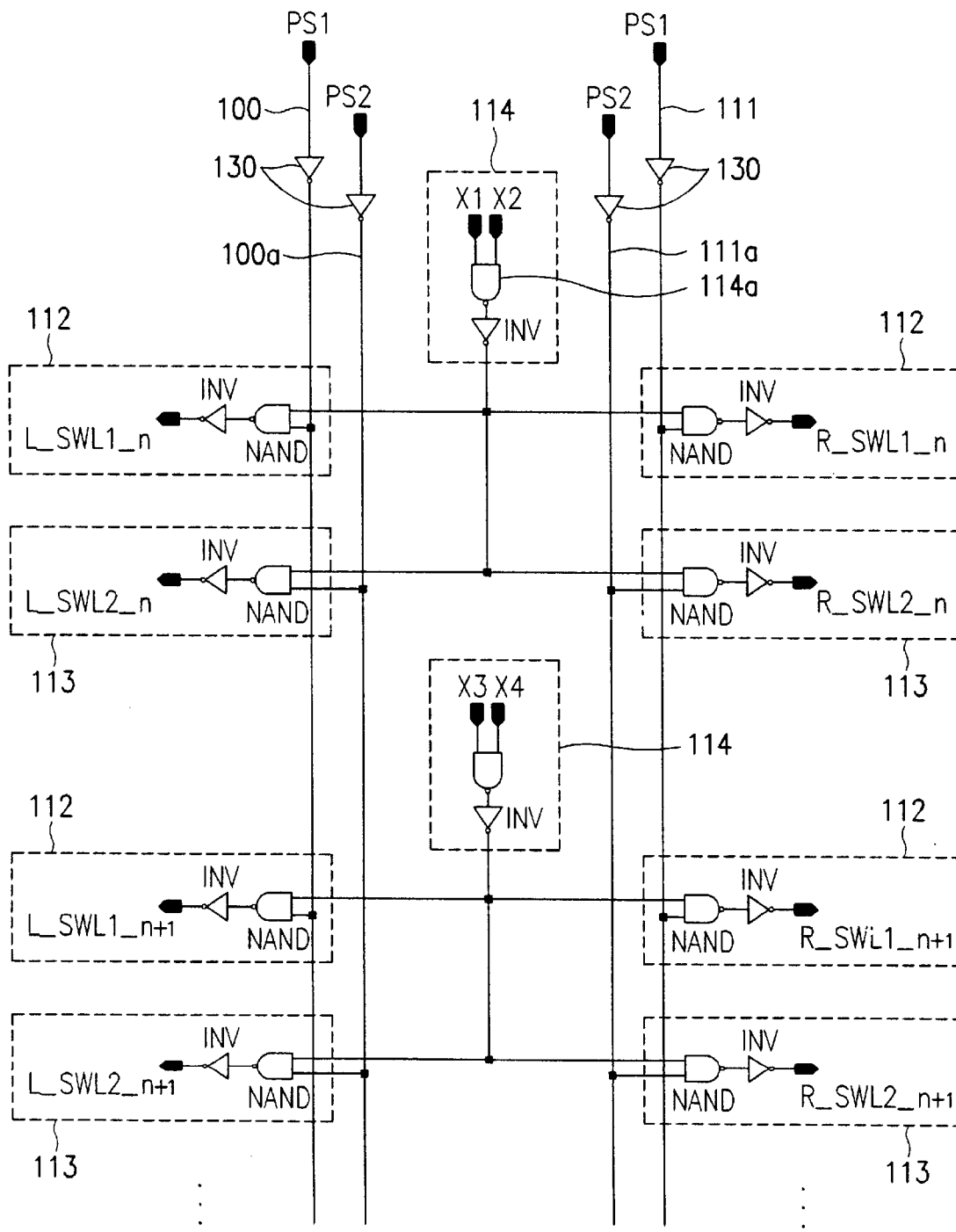
FIG. 14 illustrates a third embodiment split wordline driver for driving a nonvolatile ferroelectric memory in accordance with a preferred embodiment of the present invention.

FIG. 14 illustrates a system of a third embodiment split wordline driver in accordance with a preferred embodiment of the present invention. The third embodiment split wordline driver has an arrangement in which each of PS1 and PS2 signals provided through the first and second signal lines 100 and 100a and the third and fourth signal lines 111 and 111a, respectively, is adapted to pass through an inverter 130 before being applied to respective split wordline driving signal forwarders 112 and 113. The X-address signal forwarder 114 includes a decoder 114a with a NAND gate for receiving and decoding two or more than two X-addresses and an inverter INV for inverting a signal from the decoder 114a.

In comparison to the second embodiment, each of the SWL driving signal forwarders 112 and 113 includes an NAND gate in place of the NOR gate, with an inverter INV added to an output terminal on the NAND gate. In this third embodiment, PS1 and PS2 signals provided through the first and second signal lines 100 and 100a and the third and fourth signal lines 111 and 111a, respectively, are inverted by inverters 130 for being used as control signals for selecting the cell arrays either on the left side or on the right side. In this instance, when PS1 and PS2 signals provided through the third signal line 111 and the fourth signal line 111a respectively are enabled and a signal from the X-address signal forwarder 114 are enabled at high, the first and second SWL driving signal forwarder 112 and 113 are enabled, to enable the first and second split wordlines connected thereto respectively, writing or reading a data from or to a memory cell.

The circuit for driving a nonvolatile ferroelectric memory of the present invention has various advantages. The system of the circuit for driving a nonvolatile ferroelectric memory of the present invention, in which an address in a row direction is adapted to be applicable to both left and right cell arrays and control signals from the local control signal generator together with an X-address signal allow to select a desired memory cell, permits a simple system and a reduction in a layout area.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A memory device, comprising:
    a first memory array having a plurality of memory cells, pairs of first and second wordlines in a first direction and plurality of bitlines in a second direction, each memory cell coupled to a corresponding pair of first and second wordlines in the first direction and coupled to corresponding bitlines in the second direction;
    a first circuit that provides a plurality of first control signals to said first memory array for at least one of reading data from and writing data to a selected memory cell coupled to a corresponding pair of first and second wordlines and the corresponding bitline; and
    a first split wordline driver coupled to said first circuit and said first memory cell array, wherein said first split wordline driver provides first and second split wordline signals to the corresponding pair of first and second wordlines to the selected memory cell based on the first control signals, wherein each memory cell is coupled to a corresponding pair of first and second wordlines and is selected based on corresponding first and second split wordline signals provided on the corresponding pair or first and second wordlines.

2. The memory device of claim 1, wherein each memory cell comprises:
    a first transistor having a control electrode and first and second electrodes, the control electrode being coupled to the first wordline and the first electrode coupled to a corresponding bitline;
    a first capacitor having first and second electrodes with a ferroelectric material therebetween, the first electrode of the first capacitor being coupled to the second wordline and the second electrodes of said first capacitor and said first transistor being coupled to each other;
    a second transistor having a control electrode and first and second electrodes, the control electrode being coupled to the second wordline and the first electrode coupled to another corresponding bitline; and
    a second capacitor having first and second electrodes with a ferroelectric material therebetween, the first electrode of said second capacitor being coupled to the first wordline and the second electrodes of said second capacitor and said second transistor being coupled to each other.

3. The memory device of claim 1, wherein said first split wordline driver comprises:
    first and second signal lines coupled to receive the first control signals;
    a plurality of first signal forwarders coupled to said first signal line, each first signal forwarder providing a corresponding first wordline signal to a corresponding first wordline of said first memory array;
    a plurality of second signal forwarders coupled to said second signal line, each second signal forwarder providing a corresponding second wordline signal to a corresponding second wordline of said first memory array; and
    a plurality of address forwarders coupled to receive the first control signals such that a corresponding pair of first and second signal forwarders are enabled to provide the first and second wordline signals for the pair of first and second wordlines to the selected memory cell in the first direction.

4. The memory device of claim 3, wherein each address forwarders comprises a first logic gate coupled to receive the first control signals indicative of an address such that the corresponding pair of first and second signal forwarders are enabled.

5. The memory device of claim 4, wherein said first logic gate is a NAND gate.

6. The memory device of claim 4, wherein each address forwarders further comprises a second logic gate coupled to an output of said first logic gate.

7. The memory device of claim 6, wherein said first logic gate and said second logic gate are a NAND gate and an inverter, respectively.

8. The memory device of claim 3, wherein each of said first signal forwarders comprises first and second switches, each having a control electrode and first and second electrodes, the control electrodes being commonly coupled to said first signal line and the second electrodes being commonly coupled to each other, the first electrode of said first switch being coupled to a corresponding address forwarder and the first electrode of said second switch being coupled to a prescribed potential.

9. The memory device of claim 8, wherein each of said second signal forwarders comprises third and fourth switches, each having a control electrode and first and second electrodes, the control electrodes being commonly coupled to said second signal line and the second electrodes being commonly coupled to each other, the first electrode of said third switch being coupled to the corresponding address forwarder and the first electrode of said second switch being coupled to the prescribed potential.

10. The memory device of claim 9, wherein said first and third switches are PMOS transistors and second and fourth switches are NMOS transistors.

11. The memory device of claim 3, wherein each of said first and second signal forwarders comprises a logic gate having first and second inputs and an output coupled to one of corresponding first and second wordlines, the first input being coupled to one of said first and second signal lines and the second input being coupled to a corresponding address forwarder.

12. The memory device of claim 11, wherein said logic gate is a NOR gate.

13. The memory device of claim 3, wherein said first split wordline driver further comprises a first logic gate and a second logic gate coupled to said first and second signal lines, respectively.

14. The memory device of claim 13, wherein each of said first and second signal forwarders comprises a third logic gate having first and second inputs and an output coupled to a fourth logic gate, which is coupled to one of corresponding first and second wordlines, the first input being coupled to an output of one of said first and second logic gates and the second input being coupled to a corresponding address forwarder.

15. The memory device of claim 14, wherein said first, second and fourth logic gates are inverters, and said third logic gate is a NAND gate.

16. The memory device of claim 3 further comprising a second memory array having the same arrangement as the first memory array, said first split wordline driver being located between said first and second memory arrays.

17. The memory device of claim 16, wherein said first split wordline driver further comprises:

third and fourth signal lines coupled to receive the control signals;

a plurality of third signal forwarders coupled to said third signal line, each third signal forwarder providing a first wordline signal to a corresponding first wordline of said second memory array; and a plurality of fourth signal forwarders coupled to said fourth signal line, each fourth signal forwarder providing a second wordline signal to a corresponding second wordline of said second memory array, wherein a corresponding address forwarder is coupled to a corresponding pair of third and fourth signal forwarders.

18. The memory device of claim 17, further comprising a third memory array having the same configuration as said first memory array, said first circuit located between said first and second memory array;

a second wordline driver coupled to said first circuit and said third memory array;

a fourth memory array having the same configuration as said first memory array, said second wordline driver being located between said third and fourth memory arrays; and a second circuit that provides a plurality of second control signals for selection of a memory cell in one of said second and fourth memory cells, wherein said first control circuit provides the first control signals for selection of a memory cell in one of said first and third memory cells.

19. The memory device of claim 18, wherein said second split wordline driver has substantially the same configuration as said first split wordline driver, said first split wordline driver being responsive to the first and second control signals from said first and second circuits for selection of a memory cell in one of said first and second memory arrays, and said second split wordline driver is responsive to the first and second control signals from said first and second circuits for selection of a memory cell in one of said third and fourth memory arrays.

20. The memory device of claim 17, wherein each of said first and third signal forwarders comprises first and second switches, each having a control electrode and first and second electrodes, the control electrodes being commonly coupled to a corresponding one of said first and third signal lines and the second electrodes being commonly coupled to each other, the first electrode of said first switch being coupled to a corresponding address forwarder and the first electrode of said second switch being coupled to a prescribed potential.

21. The memory device of claim 20, wherein each of said second and fourth signal forwarders comprises third and fourth switches, each having a control electrode and first and second electrodes, the control electrodes being commonly coupled to a corresponding one of said second and fourth signal lines and the second electrodes being commonly coupled to each other, the first electrode of said third switch being coupled to the corresponding address forwarder and the first electrode of said second switch being coupled to the prescribed potential.

22. The memory device of claim 17, wherein each of said first, second, third and fourth signal forwarders comprises a logic gate having first and second inputs and an output coupled to one of corresponding first and second wordlines, the first input being coupled to one of said first, second, third and fourth signal lines and the second input being coupled to a corresponding address forwarder.

23. The memory device of claim 17, wherein said first split wordline driver further comprises a first logic gate and a second logic gate coupled to said first and second signal lines, respectively, and a third logic gate and a fourth logic gate coupled to said third and fourth signal lines, respectively.

24. The memory device of claim 23, wherein each of said first, second, third and fourth signal forwarders comprises a third logic gate having first and second inputs and an output coupled to a fourth logic gate, which is coupled to corresponding one of first and second wordlines, the first input being coupled to an output of a corresponding one of said first, second, third and fourth logic gates and the second input being coupled to a corresponding address forwarder.

25. A word line driver for a memory array having memory cells arranged in rows and columns, the memory cells in a corresponding row being coupled to a pair of split word lines, the word line driver comprising:

a word line drive control signal generator that receives an input pulse, adjusts a pulse width of the input pulse, and executes a first prescribed operation on the input pulse and the adjusted pulse to generate first, second and third word line drive control signals;

an address decoding signal generator that executes a second prescribed operation on the first, second and third word line drive control signals and first, second, third and fourth address buffer signals to generate first, second and third address decoding signals; and a word line drive signal generator that executes a prescribed third operation on the first, second and third address decoding signals to generate first and second word line drive signals which are applied to a corresponding pair of split word lines coupled to a corresponding row of memory cells to select a memory cell coupled to the corresponding pair of split wordlines.

26. The word line driver of claim 25, wherein said word line drive control signal generator includes:

first pulse width controller receiving the input pulse, expanding the width of the input pulse and outputting a first pulse having a first adjusted pulse width;

a first logic circuit executing a first logical operation on the first pulse of said first pulse width controller and the input pulse and outputting a first result of the first logical operation;

second pulse width controller receiving the first result of said first logic circuit, expanding the width the input pulse and outputting a second pulse having a second adjusted pulse width;

a second logic circuit receiving an inverted input pulse, the first result of the first logic circuit and the second pulse of the second pulse width controller, executing a filtering operation and outputting a first filtered result;

a third logic circuit receiving the inverted input pulse, the first filtered result of the second logic circuit and the first pulse of the first pulse width controller, executing a filtering operation and outputting a second filtered result;

a fourth logic circuit receiving a signal which has a pulse width adjusted in a first stage of said first pulse width controller and is outputted therefrom and the first and second filtered result of the second and third circuits, executing a filtering operation and outputting a third filtered result; and first, second and third word line drive control signal generators receiving the first, second and third filtered results of said second, third and fourth logic circuits and generating first, second and third word line drive control signals, respectively.

27. The word line driver of claim 26, wherein said first logic circuit is a NOR gate, and said second, third and fourth logic circuits are NAND gates.

28. The word line driver of claim 26, wherein each of said first, second and third word line drive control signal generators comprises a buffer having two inverters coupled in series.

29. The word line driver of claim 26, wherein each of said first and second pulse width controllers comprises a plurality of inverters coupled in series and at least one inverter is provided with a pair of PMOS and NMOS whose current ratio is different from each other.

30. The word line driver of claim 29, wherein the PMOS having a different current ratio from the NMOS in one inverter has a width to length ratio of 2:4, and the NMOS having a different current ratio from the PMOS in one inverter has a width to length ratio of 4:0.7.

31. The word line driver of claim 29, wherein a width to length ratio of the PMOS and the NMOS of an inverter which does not adjust the width of the pulse inputted in the first and second pulse width controller is 12:0.8.

32. The word line driver of claim 25, wherein said address decoding signal generator includes:

a first address decoding signal output circuit receiving the first and second address buffer signals and the first word line drive control signal executing a NAND operation, inverting the output of the NAND operation and generating the first address decoding signal;

a second address decoding signal output circuit receiving the third and fourth address buffer signals and the second word line drive control signal, executing a NAND operation, inverting the output of the NAND operation and generating the second address decoding signal; and a third address decoding signal output circuit receiving the third and fourth address buffer signals and the third word line drive control signal, executing a NAND operation, inverting the output of the NAND operation and generating the third address decoding signal.

33. The word line driver of claim 32, wherein each of said first, second and third address decoding signal output circuits includes a NAND gate and an inverter coupled to an output terminal of said NAND gate.

34. The word line driver of claim 25, wherein said word line drive signal generator includes:

a first word line drive signal generator receiving the first address decoding signal and the second address decoding signal, executing a NAND operation, inverting the output of the NAND operation and generating the first word line drive signal; and a second word line drive signal generator receiving the first address decoding signal and the third address decoding signal, executing a NAND operation, inverting the output of the NAND operation and generating the second word line drive signal.

35. The word line driver of claim 34, wherein each of said first and second word line drive signal generators includes a NAND gate and an inverter coupled with an output terminal of said NAND gate.

* * * * *